US009000495B2

(12) United States Patent
Yamashita

(10) Patent No.: US 9,000,495 B2
(45) Date of Patent: Apr. 7, 2015

(54) SEMICONDUCTOR APPARATUS HAVING PENETRATION ELECTRODE AND METHOD FOR MANUFACTURING THE SAME

(75) Inventor: Daisuke Yamashita, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 558 days.

(21) Appl. No.: 13/228,293

(22) Filed: Sep. 8, 2011

(65) Prior Publication Data

US 2012/0187544 A1 Jul. 26, 2012

(30) Foreign Application Priority Data

Jan. 20, 2011 (JP) ................ P2011-009528

(51) Int. Cl.
*H01L 23/48* (2006.01)
*H01L 21/70* (2006.01)
*H01L 29/40* (2006.01)
*H01L 21/66* (2006.01)
(Continued)

(52) U.S. Cl.
CPC ....... *H01L 22/32* (2013.01); *H01L 2224/03614* (2013.01); *H01L 24/03* (2013.01); *H01L 24/05* (2013.01); *H01L 21/6835* (2013.01); *H01L 21/6836* (2013.01); *H01L 2221/68327* (2013.01); *H01L 2221/68336* (2013.01); *H01L 2221/68368* (2013.01); *H01L 2224/0345* (2013.01); *H01L 2224/0346* (2013.01); *H01L 2224/0348* (2013.01); *H01L 2224/04026* (2013.01); *H01L 2224/05124* (2013.01); *H01L 2224/05155* (2013.01); *H01L 2224/05166* (2013.01); *H01L 2224/05644* (2013.01); *H01L 2224/291* (2013.01); *H01L 2224/32245* (2013.01); *H01L 2924/13055* (2013.01); *H01L 2924/3511* (2013.01)

(58) Field of Classification Search
USPC .......................................... 257/276, 502, 621
See application file for complete search history.

(56) References Cited

U.S. PATENT DOCUMENTS 5,162,258 A * 11/1992 Lemnios et al. ................ 438/10
6,531,370 B2 * 3/2003 Sakamoto et al. ............ 438/343
7,105,933 B2 * 9/2006 Haza et al. ..................... 257/786
(Continued)

FOREIGN PATENT DOCUMENTS

JP 356124240 * 9/1981
JP 2002-176142 6/2002
(Continued)

OTHER PUBLICATIONS

Japanese Office Action; Japanese Patent Application No. 2011-009528; Mailed Apr. 11, 2014 (with English translation).

*Primary Examiner* — James Mitchell
(74) *Attorney, Agent, or Firm* — Patterson & Sheridan, LLP

(57) ABSTRACT

According to one embodiment, in a semiconductor apparatus, a semiconductor substrate has a first surface and a second surface opposite to the first surface. A semiconductor device is formed in a rectangular region enclosed by a plurality of dicing lines of the semiconductor substrate. The semiconductor device includes a first electrode provided on the first surface and a second electrode provided on the second surface so as to pass a current between the first electrode and the second electrode. A penetration electrode is formed in a region not enclosed by the dicing lines of the semiconductor substrate. One end of the penetration electrode extends on the first surface. The other end of the penetration electrode is electrically connected to the second electrode.

12 Claims, 10 Drawing Sheets

(51) Int. Cl.
*H01L 23/00* (2006.01)
*H01L 21/683* (2006.01)

(56) References Cited

U.S. PATENT DOCUMENTS

| | | | | |
|---|---|---|---|---|
| 7,488,647 B1* | 2/2009 | Dark et al. | .................... | 438/259 |
| 8,030,780 B2* | 10/2011 | Kirby et al. | .................... | 257/774 |
| 8,222,139 B2* | 7/2012 | Chen et al. | .................... | 438/667 |
| 8,367,553 B2* | 2/2013 | Tsao et al. | .................... | 438/692 |
| 8,501,587 B2* | 8/2013 | Chen et al. | .................... | 438/459 |
| 2002/0180026 A1* | 12/2002 | Liu et al. | ........................ | 257/692 |
| 2004/0235234 A1* | 11/2004 | Sawada et al. | ................ | 438/222 |
| 2005/0181540 A1* | 8/2005 | Farnworth et al. | ............ | 438/113 |
| 2008/0128883 A1* | 6/2008 | Lee | ............................... | 257/686 |
| 2009/0134420 A1* | 5/2009 | Nagai | .............................. | 257/98 |
| 2009/0140394 A1* | 6/2009 | Bathan et al. | .................. | 257/621 |
| 2011/0084350 A1* | 4/2011 | Murakoshi et al. | ............ | 257/432 |
| 2011/0147772 A1* | 6/2011 | Lochtefeld et al. | ............. | 257/94 |
| 2012/0097944 A1* | 4/2012 | Lin et al. | .......................... | 257/48 |
| 2012/0105093 A1* | 5/2012 | Lee | .......................... | 324/762.01 |

FOREIGN PATENT DOCUMENTS

| | | |
|---|---|---|
| JP | 2003-092375 | 3/2003 |
| JP | 2008-103421 | 5/2008 |
| JP | 2008-171924 | 7/2008 |

* cited by examiner

SEMICONDUCTOR APPARATUS HAVING PENETRATION ELECTRODE AND METHOD FOR MANUFACTURING THE SAME

CROSS REFERENCE TO RELATED APPLICATION

This application is based upon and claims the benefit of priority from the prior Japanese Patent Application No. 2011-009528, filed on Jan. 20, 2011, the entire contents of which are incorporated herein by reference.

FIELD

Embodiments described herein relate generally to a semiconductor apparatus having a penetration electrode and a method for manufacturing the semiconductor apparatus.

BACKGROUND

In a process of manufacturing a semiconductor apparatus, characteristics of semiconductor devices are measured using a tester when each of the semiconductor devices is formed in a rectangular region enclosed by dicing lines of a semiconductor substrate, and the process of manufacture is managed on the basis of the measurement result.

In a vertical semiconductor device in which the electric current flows in a thickness direction of a semiconductor substrate, probes of a tester are brought into contact with a front surface electrode and a back surface electrode of the semiconductor device to measure the characteristic of the semiconductor device. For this reason, the semiconductor substrate is directly sucked by a conductive stage, and the probe is electrically connected to the conductive stage, so that a contact between the probe and the back surface electrode is obtained.

However, as the output power of the semiconductor device increases, the semiconductor device is grinded and made thin in order to improve heat radiation, and the back surface electrode is formed in the final step. As a result, there is a problem in that a large warpage occurs in the semiconductor substrate, which makes it difficult to cause the semiconductor substrate to be directly sucked by the stage. This is because it is highly possible that the semiconductor substrate is damaged during the attaching/detaching operation.

In order to prevent breakage of the thin semiconductor substrate, the semiconductor substrate may be reinforced by attaching the semiconductor substrate to an adhesive sheet. However, in this case, there is a problem that the contact with the back surface electrode cannot be obtained.

In some cases, a penetration electrode is provided in a semiconductor device region to perform characteristic test, so that the back surface electrode is electrically connected to the front surface side. However, there is a problem in that the penetration electrode becomes thick to ensure the capacity of the electric current, and moreover, the penetration electrode ultimately becomes unnecessary. Therefore, the chip size is increased.

DETAILED DESCRIPTION

Figure 1:
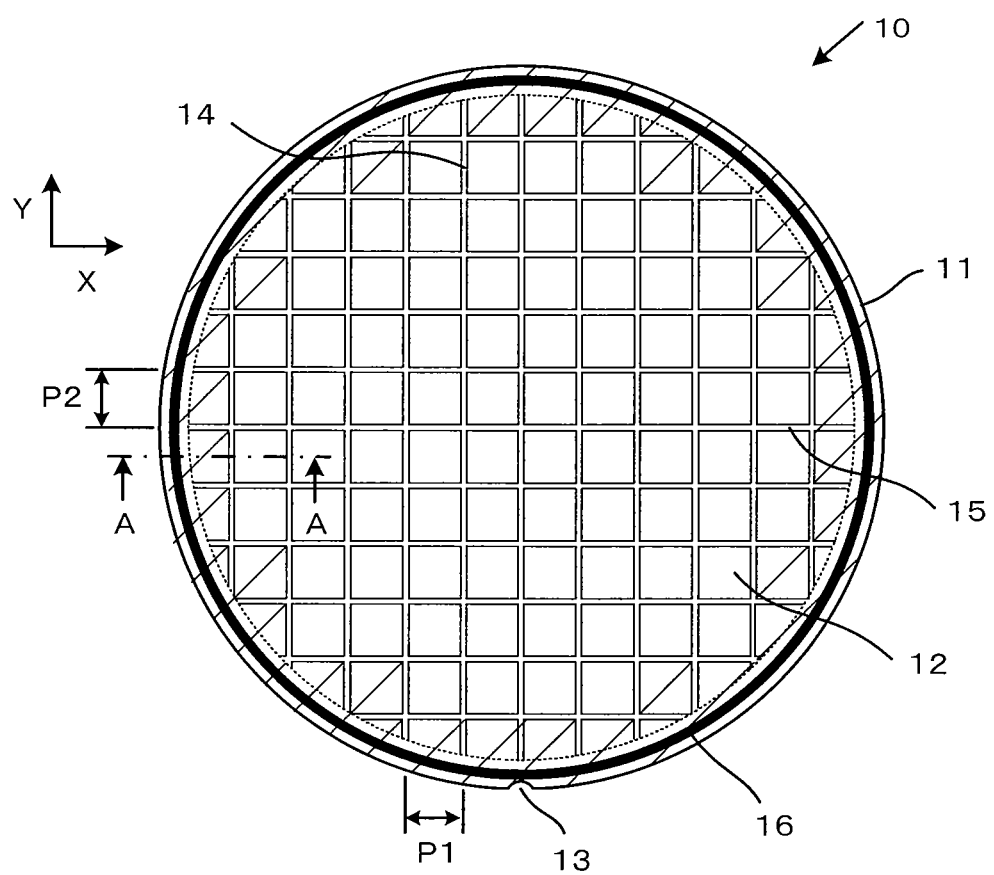
FIG. 1 is a top view illustrating a semiconductor apparatus according to an embodiment.

According to one embodiment, in a semiconductor apparatus, a semiconductor substrate has a first surface and a second surface opposite to the first surface. A semiconductor device is formed in a rectangular region enclosed by a plurality of dicing lines of the semiconductor substrate. The semiconductor device includes a first electrode provided on the first surface and a second electrode provided on the second surface so as to pass a current between the first electrode and the second electrode. A penetration electrode is formed in a region not enclosed by the dicing lines of the semiconductor substrate. One end of the penetration electrode extends on the first surface. The other end of the penetration electrode is electrically connected to the second electrode.

Hereinafter, one embodiment will be described with reference to the drawings. In the drawings, same reference characters denote the same or similar portions.

Embodiment

Figure 2:
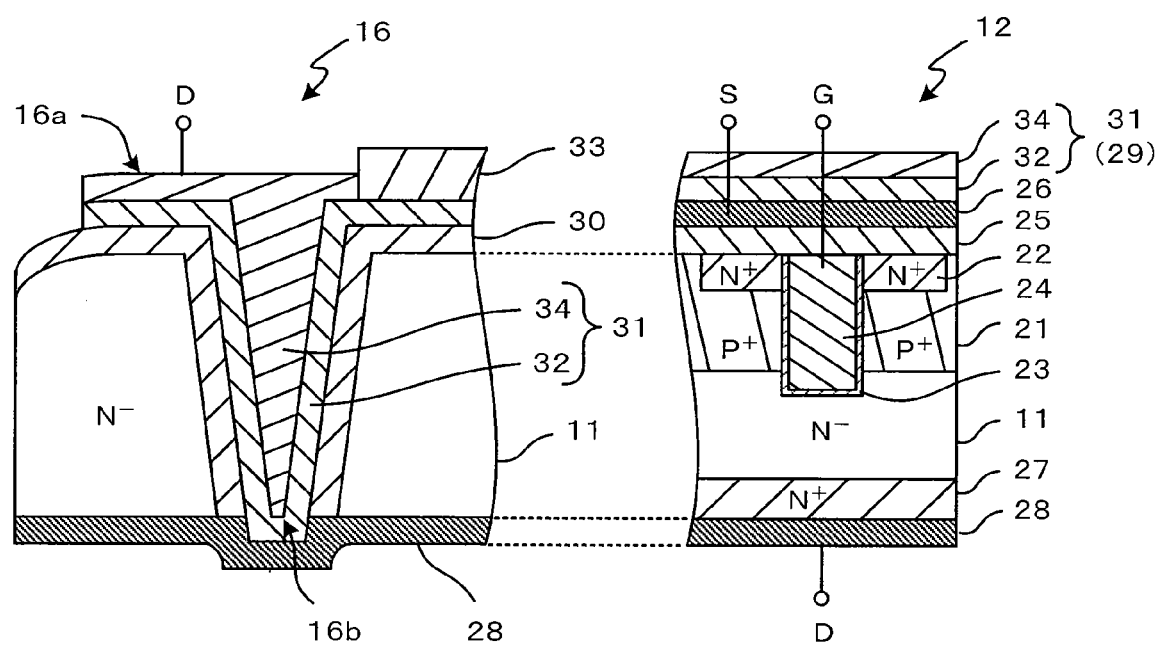
FIG. 2 is cross-sectional views taken along line A-A of FIG. 1 as seen from arrow direction according to the embodiment.

An embodiment will be described with reference to FIGS. 1 and 2. FIG. 1 is a top view illustrating a semiconductor apparatus according to the embodiment. FIG. 2 is a cross sectional view taken along line A-A of FIG. 1 as seen from arrow direction.

As shown in FIG. 1, in a semiconductor apparatus 10 of the embodiment, a semiconductor substrate 11 is an N-type silicon substrate having, e.g., a diameter of 200 mm and a thickness of 50 μm. Two or more vertical semiconductor devices 12, e.g., trench gate MOS transistors each having a size of several millimeters, are formed on a first surface of the semiconductor substrate 11.

In the trench gate MOS transistor, a source electrode (first electrode) and a gate electrode are formed on the first surface, and a drain electrode (second electrode) is formed on a second surface opposite to the first surface.

The semiconductor devices 12 are arranged with a pitch P1 in X direction perpendicular to a direction in which a notch 13 is formed, and are arranged with a pitch P2 in Y direction perpendicular to X direction. Dicing lines 14 are arranged with the pitch P1 in X direction between semiconductor devices 12 adjacent to each other in X direction. Likewise, dicing lines 15 are arranged with the pitch P2 in Y direction between semiconductor devices 12 adjacent to each other in Y direction.

That is, the dicing lines 14, 15 are formed in a matrix form on the first surface of the semiconductor substrate 11. Each of the semiconductor devices 12 is formed in a rectangular region enclosed by the dicing lines 14, 15.

A penetration electrode 16 penetrating from the first surface to the second surface is formed in a region of the semiconductor substrate 11 that is not enclosed by the dicing lines 14, 15 (hatched region in the figure). In this case, the penetration electrode 16 is formed in a ring shape along the outer periphery of the semiconductor substrate 11.

The penetration electrode 16 is formed such that one end of the penetration electrode 16 extends on the first surface, and the other end of the penetration electrode 16 is electrically connected to the drain electrode.

The semiconductor substrate 11 is placed on a dicing tape, and the semiconductor apparatus 10 is respectively cut along the dicing lines 14 and the dicing lines 15 by a blade having a thickness of 50 μm, for example, so that each semiconductor device 12 is divided into an individual semiconductor chip. Each of the widths of the dicing line 14 and the dicing line 15 is about 100 μm, which is twice the thickness of the blade, for example.

FIG. 2 is a cross sectional view taken along line A-A of FIG. 1 as seen from the direction of arrows. The right side of FIG. 2 is a cross sectional view illustrating the semiconductor device 12. The left side of FIG. 2 is a cross sectional view illustrating the penetration electrode 16. The structure of the trench gate MOS transistor is well-known. However, the structure of the trench gate MOS transistor will be briefly explained below.

As shown in FIG. 2, in the semiconductor device 12, a P+ base layer 21 is formed from the first surface of the N− semiconductor substrate 11 to some level in the N− semiconductor substrate 11. In the upper portion of the P+ base layer 21, an N+ diffusion layer (source impurity layer) 22 is formed from the first surface to some level in the P+ base layer 21.

A gate insulating film 23 is formed on an inner surface of a trench penetrating from the first surface through the N+ diffusion layer 22 and the P+ base layer 21 and reaching some level in the semiconductor substrate 11. A gate electrode 24 is formed to be buried into the trench with the gate insulating film 23 interposed therebetween.

An insulating film 25 is formed to cover the upper surface of the P+ base layer 21, N+ diffusion layer 22, and the gate electrode 24. A source electrode 26 electrically connected to the N+ diffusion layer 22 is formed on the insulating film 25. The gate electrode 24 is insulated from the source electrode 26, and the gate electrode 24 is connected to a point on the insulating film 25.

An N+ diffusion layer (drain impurity layer) 27 is formed from the second surface of the N− semiconductor substrate 11 to some level in the N− semiconductor substrate 11. A drain electrode 28 is formed on the second surface of the semiconductor substrate 11. The N− semiconductor substrate 11 between the P+ base layer 21 and the N+ diffusion layer 27 is a drift layer in which electrons run.

The semiconductor device 12 is formed with a pad 29 for soldering a lead plate or a lead band. The pad 29 is formed on the source electrode 26 and the point connected to the gate electrode 24. The pad 29 is the same as conductive member 31 made by laminating a TiW/Al laminated film 32 and a nickel/gold (NiAu) plated layer 34 explained later.

On the other hand, in the penetration electrode 16, an insulating film 30 is formed conformally on the first surface of the semiconductor substrate 11 and side surfaces of a trench penetrating from the first surface of the N− semiconductor substrate 11 through the N− semiconductor substrate 11 and reaching the second surface of the semiconductor substrate 11 (through-hole). The insulating film 30 is a tetra ethyl ortho silicate (TEOS) film formed by a chemical vapor deposition (CVD) method, for example.

The conductive member 31 is formed to be buried into the trench with the insulating film 30 interposed therebetween. The conductive member 31 is a laminated conductive body made of a barrier metal layer formed on the insulating film 30, a seed layer formed on the barrier metal, and a plated layer formed on the seed layer.

More specifically, a TiW/Al laminated film 32 is conformally formed on the insulating film 30 on the first surface and the side surfaces of the trench. The TiW/Al laminated film 32 is made by laminating a barrier metal such as titanium tungsten (TiW) and a seed metal such as aluminum (Al). The end of the TiW/Al laminated film 32 protrudes from the second surface of the semiconductor substrate 11 and is closed in a form of a pouch.

A passivation film 33 such as a polyimide film is formed on the TiW/Al laminated film 32 in such a manner that the opening of the trench at the first surface side is exposed. Using the passivation film 33 as a mask, the nickel/gold (NiAu) plated layer 34 is formed to be buried into the trench with the TiW/Al laminated film 32 interposed therebetween.

The Al film serves as a seed for extracting NiAu in the electrolytic plating, and the TiW film prevents NiAu from diffusing into the semiconductor substrate 11.

A drain electrode 28 is formed to cover the end portion of the TiW/Al laminated film 32 protruding from the second surface of the semiconductor substrate 11.

In this configuration, in the penetration electrode 16, one end 16a of the conductive member 31 (the TiW/Al laminated film 32 and the NiAu plated layer 34) extends on the first surface of the semiconductor substrate 11, and the other end 16b thereof is electrically connected to the drain electrode 28.

The drain electrode 28 formed on the second surface of the semiconductor substrate 11 is connected to the first surface side of the semiconductor substrate 11 via the penetration electrode 16. The one end 16a serves as a contact pad to the drain electrode 28.

The characteristic test of the semiconductor device 12 can be carried out in the wafer size by bringing the probe, from the first surface side of the semiconductor substrate 11, into contact with the one end 16a, the source electrode 26, and the point connected to the gate electrode 24.

Subsequently, the method for manufacturing the semiconductor apparatus 10 will be explained. FIGS. 3A to 7B are cross sectional views illustrating steps for producing the penetration electrode 16 of the semiconductor apparatus 10.

Figure 3A:
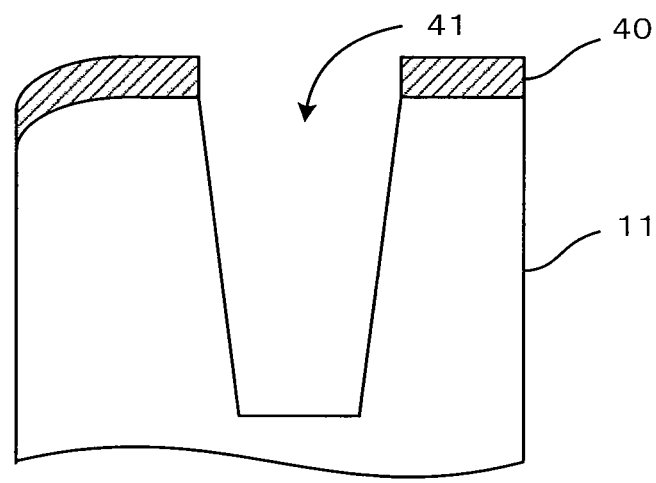
FIGS. 3A to 7B are cross-sectional views illustrating steps for producing a penetration electrode of the semiconductor apparatus in order according to the embodiment.

As shown in FIG. 3A, a mask material 40 having a ring-shaped opening is formed along the outer periphery of the N− semiconductor substrate 11 whose initial thickness is about 800 μm, for example. More specifically, the mask material 40 is formed by forming a silicon oxide film by, e.g., the CVD method and patterning the silicon oxide film by a photolithography method.

Using the mask material 40, the ring-shaped trench 41 is formed by a reactive ion etching (RIE) method using a gas of a fluorine system. The trench 41 has about a width of 100 μm and a depth of 50 μm, for example.

Figure 3B:
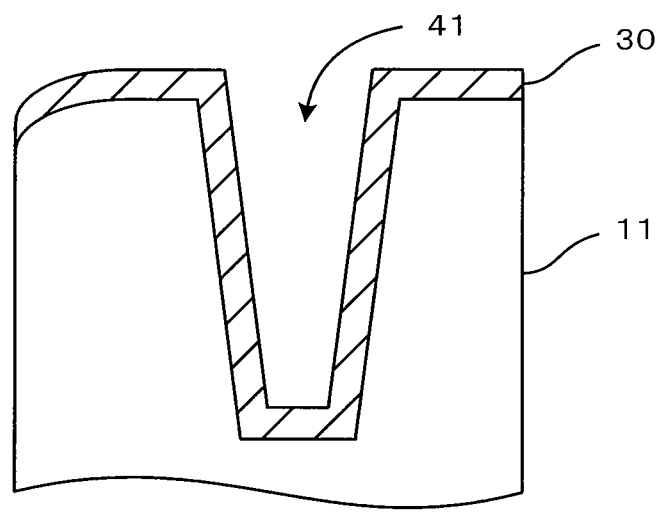

After the mask material 40 is removed by, e.g., wet etching, the insulating film 30, e.g., a silicon oxide film having a thickness of about 200 nm by the CVD method is conformally formed on the first surface of the semiconductor substrate 11 and the inner surface of the trench 41 as shown in FIG. 3B.

Figure 4A:
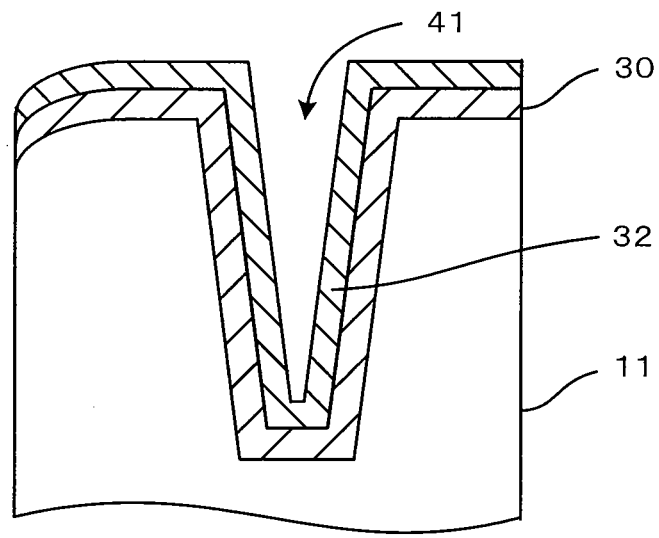

As shown in FIG. 4A, the TiW/Al laminated film 32 is conformally formed on the insulating film 30 in the trench 41 and the insulating film 30 of the first surface of the semiconductor substrate 11. More specifically, a TiW film is formed by, e.g., a sputtering method, and an Al film is formed on the TiW film by the sputtering method.

By the way, the step of forming the semiconductor device 12 is carried out between the step as shown in FIG. 3B and the step as shown in FIG. 4A except the step of forming the drain electrode 28. Therefore, the TiW/Al laminated film 32 is simultaneously formed on the source electrode 26 and the point connected to the gate electrode 24.

Figure 4B:
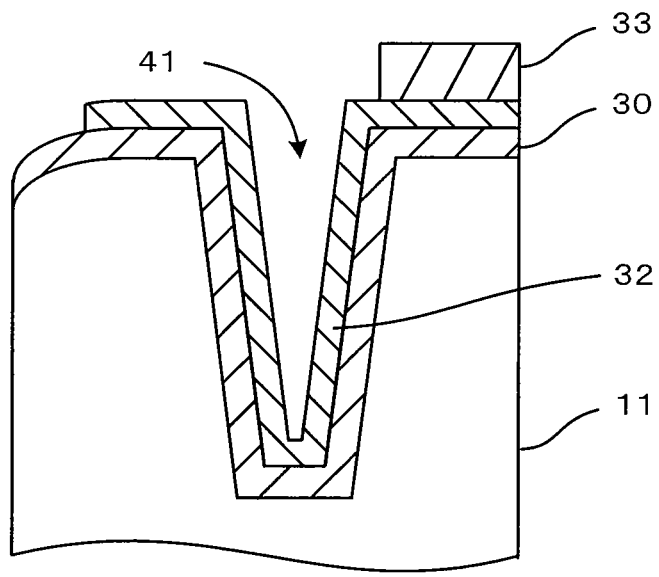

As shown in FIG. 4B, the TiW/Al laminated film 32 at the edge of the semiconductor substrate 11 is removed by wet etching, and thereafter, for example, a polyimide film is formed as the passivation film 33 to cover the inner side of the first surface with respect to the ring-shaped trench 41.

The passivation film 33 is formed such that the source electrode 26 and the point connected to the gate electrode 24 of the semiconductor apparatus 12 are exposed.

Figure 5A:
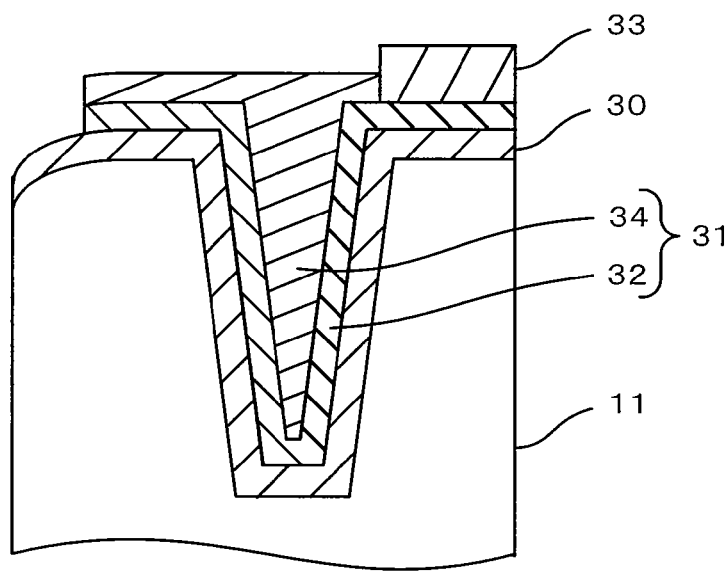
Figure 5B:
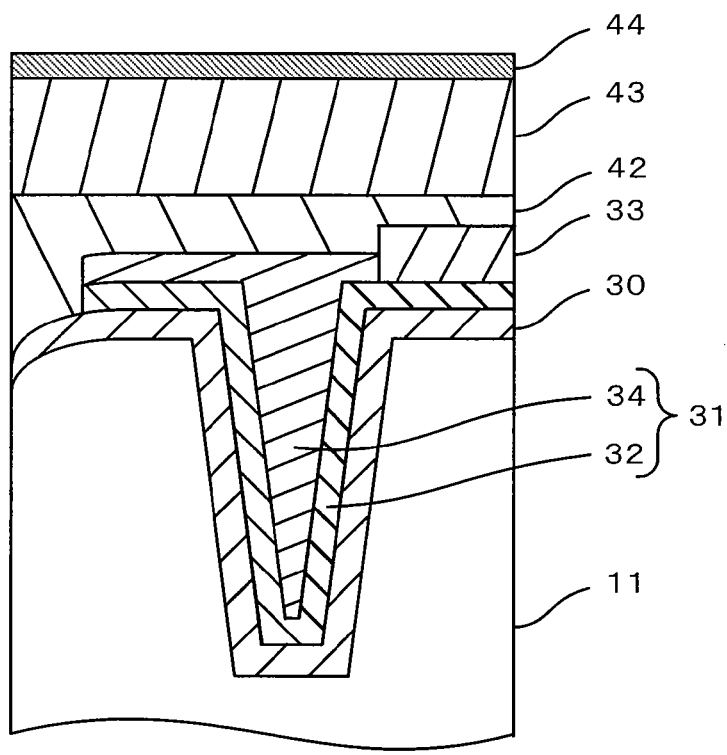

As shown in FIG. 5B, the NiAu plated layer 34 is formed to be buried into the trench 41 by the electrolytic plating. The NiAu plated layer 34 is also formed on the first surface at the outer side with respect to the trench 41.

The NiAu plated layer 34 is simultaneously formed on the source electrode 26 and the point connected to the gate electrode 24. As a result, the conductive member 31 is formed simultaneously with the pad 29.

As shown in FIG. 5B, a support member 43 is pasted at the first surface side of the semiconductor substrate 11 with a temporary holding member 42 interposed therebetween. An adhesive tape 44 is attached to the support member 43. The temporary holding member 42 is an adhesive agent, e.g., wax. The support member 43 is a dummy wafer, a glass plate, or a plastic plate, for example.

Figure 6A:
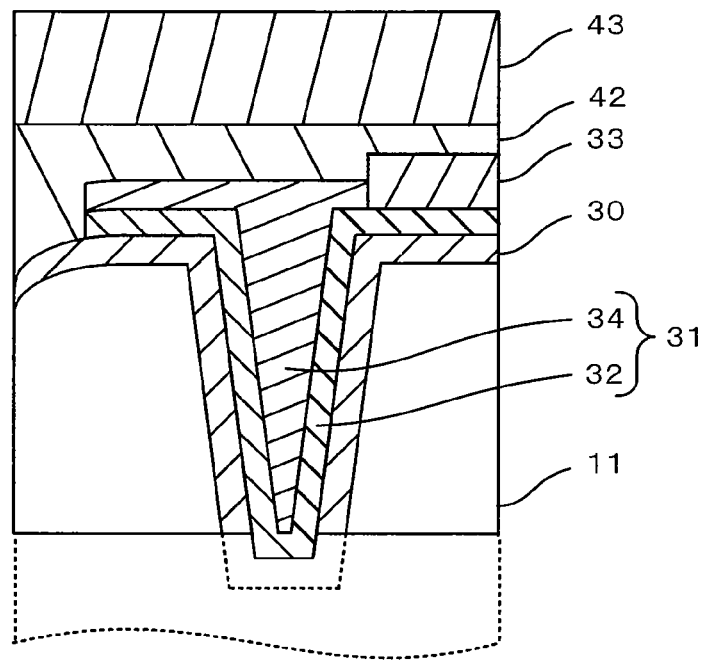

As shown in FIG. 6A, the semiconductor substrate 11 is fixed via the tape 44 to a stage of a grinder, and the semiconductor substrate 11 is grinded from the second surface side to about a bottom portion of the trench 41, and thereafter, the semiconductor substrate 11 is made thin by wet etching until the bottom portion of the trench 41 protrudes from the second surface.

For example, the insulating film 30 of the protruding portion is removed by a chemical mechanical polishing (CMP) method, whereby the TiW/Al laminated film 32 is protruded. As a result, the semiconductor substrate 11 is thinned into a thickness of 50 µm, and the semiconductor substrate 11 reinforced by the support member 43 is obtained.

Figure 6B:
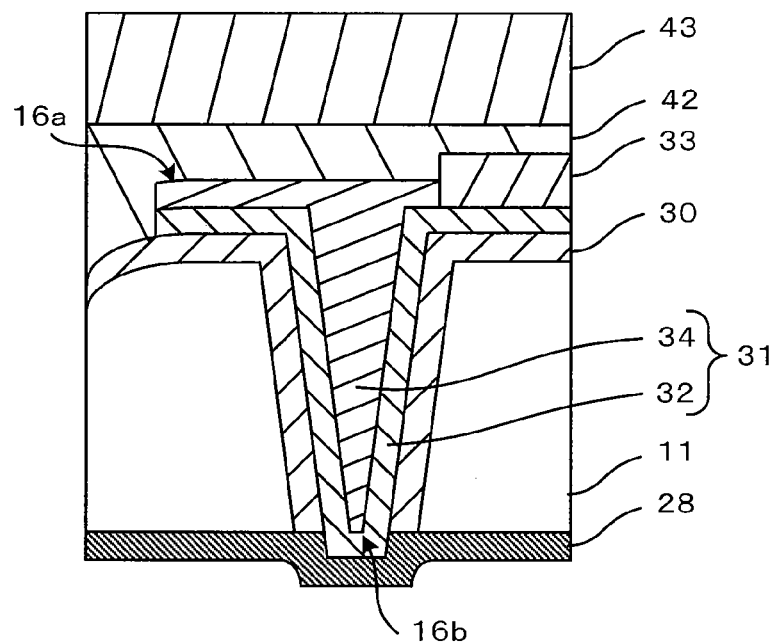

As shown in FIG. 6B, the drain electrode 28 is formed on the second surface of the semiconductor substrate 11 by the sputtering method, for example. Accordingly, the penetration electrode 16 is formed such that one end 16a extends on the first surface of the semiconductor substrate 11, and the other end 16b is electrically connected to the drain electrode 28.

In the above-mentioned steps of producing the penetration electrode 16, the formation of the TiW/Al laminated film 32, the formation of the passivation film 33, and the formation of the NiAu plated layer 34 are the same as the steps of producing the semiconductor device 12. The steps of producing the penetration electrode 16 and the steps of producing the semiconductor device 12 can be performed at the same time. In the above-mentioned steps of producing the penetration electrode 16, only the steps of forming the trench 41 and forming the insulating film 30 are additionally required.

Figure 7A:
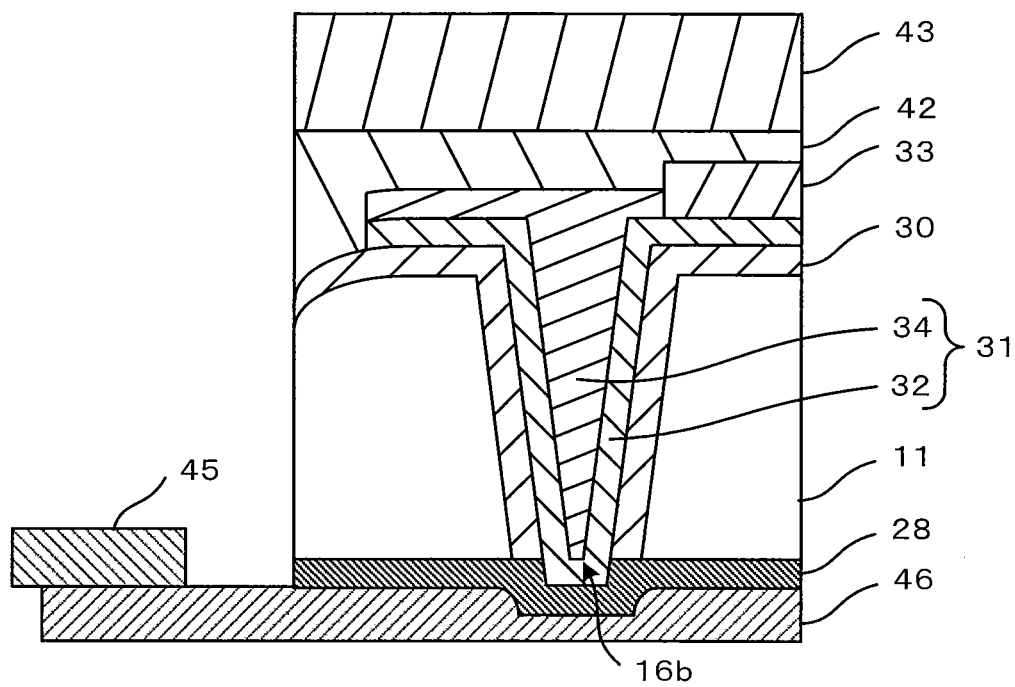

As shown in FIG. 7A, a dicing sheet 46 is expanded and attached to a dicing ring 45 in an isotropic manner, and thereafter, the second surface of the semiconductor substrate 11 is pasted to the dicing sheet 46.

Figure 7B:
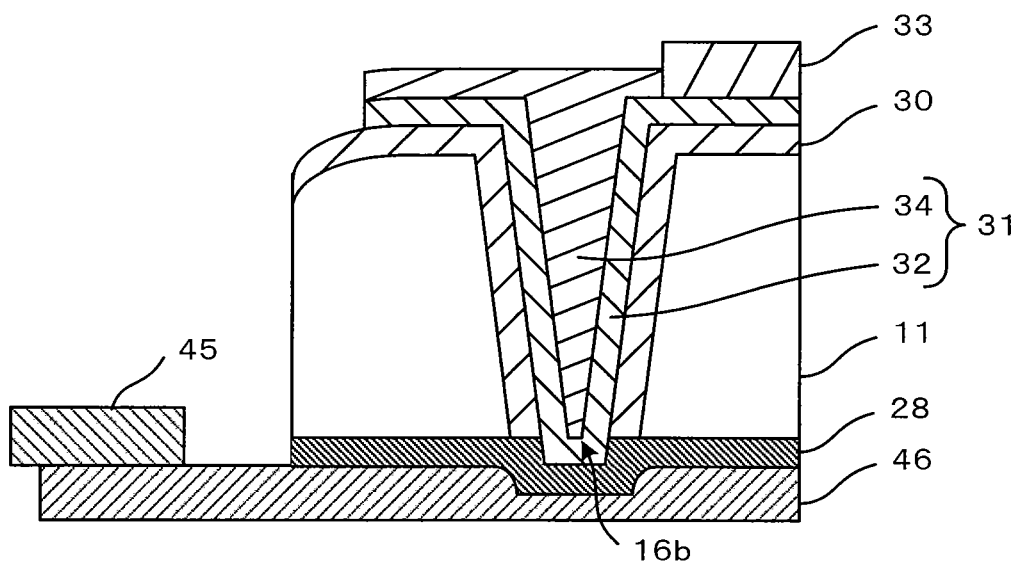

As shown in FIG. 7B, the support member 43 and the temporary holding member 42 are removed, and the semiconductor substrate 11 is transferred onto the dicing sheet 46. The rigidity of the semiconductor substrate 11 having a thin thickness, i.e., 50 µm, is mechanically reinforced, so that the semiconductor substrate 11 can be easily handled.

When the dicing ring 45 is attached to the tester, the characteristic test of the semiconductor device 12 can be performed at the first surface side of the semiconductor substrate 11. Moreover, the semiconductor substrate 11 would not be damaged during attachment/detachment operation to the tester.

Figure 8:
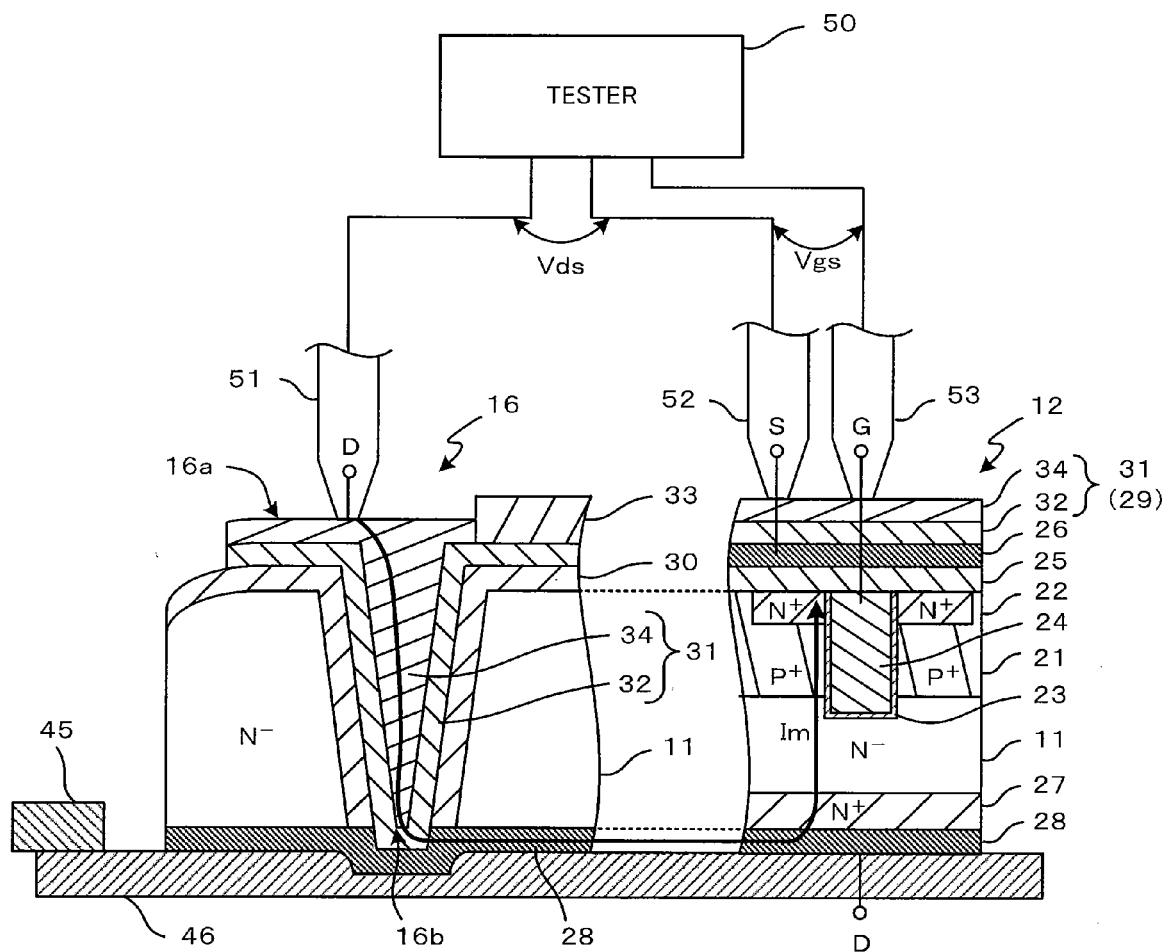
FIG. 8 is a figure for explaining a method for measuring characteristic of a semiconductor device of the semiconductor apparatus according to the embodiment.

FIG. 8 is a figure for explaining a method for measuring characteristic of the semiconductor device 12. As shown in FIG. 8, the drain electrode 28, the source electrode 26, and the gate electrode 24 of the semiconductor device 12 are electrically connected to the tester via the probes 51, 52, 53, respectively.

More specifically, the probe 51 of a tester 50 is in contact with the one end 16a of the penetration electrode 16 connected to the drain electrode 28. The probe 52 is in contact with the source electrode 26. The probe 53 is in contact with the point, provided above the first surface that is connected to the gate electrode 24. Therefore, a current path is formed that is capable of passing an electric current to the semiconductor device 12 via the penetration electrode 16.

The tester 50 applies a drain-source voltage Vds between the probes 51, 52, and applies a gate-source voltage Vgs between the probes 52, 53. An electric current Im flows through a channel immediately below the gate electrode 24 in accordance with the gate-source voltage Vgs, and the characteristic of the semiconductor device 12 is measured.

The position where the probe 51 is in contact with the one end 16a of the penetration electrode 16 may be any position of the ring. This is because the electric current Im flows in a radiating manner between the penetration electrode 16 and the drain diffusion layer 27.

As described above, in the semiconductor apparatus 10 of the embodiment, the semiconductor devices 12 are formed in rectangular regions enclosed by the dicing lines 14, 15 of the semiconductor substrate 11, and the ring-shaped penetration electrode 16 is formed along the outer periphery of the semiconductor substrate 11.

As a result, the conduction of the drain electrode 28 can be obtained from the first surface side of the semiconductor substrate 11. Therefore, the vertical semiconductor apparatus and the method for manufacturing the same can be obtained in which the characteristic test can be performed from the front surface side.

Most of the steps of producing the penetration electrode 16 are the same as the steps of producing the semiconductor device 12, and the penetration electrode 16 and the semiconductor device 12 can be formed at the same time. Therefore, the number of steps newly added to form the penetration electrode 16 can be restrained.

Since the penetration electrode 16 is formed as a common electrode in the region that is not enclosed by the dicing lines 14, 15, this prevents the increase of the chip size as compared with a case where the penetration electrode is provided in each of the semiconductor device region. As a result, the theoretical gross of the chip does not decrease.

In the explanation about this case, the semiconductor device 12 is the trench gate MOS transistor. However, the same applies even when the semiconductor device 12 is other vertical semiconductor devices such as a planar gate vertical MOS transistor, an insulated gate bipolar transistor (IGBT), and a vertical diode.

Figure 9:
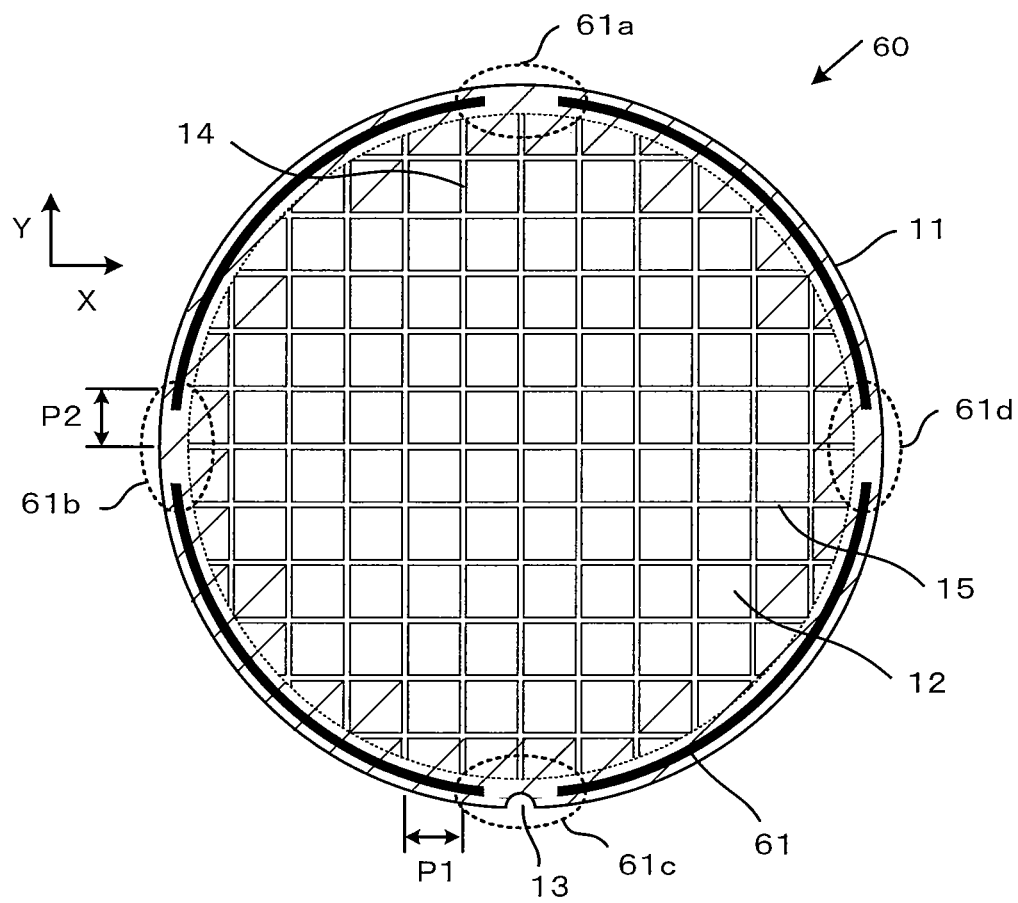
FIG. 9 is a top view illustrating another semiconductor apparatus according to the embodiment.

In the above explanation, the penetration electrode 16 is in the ring shape. Alternatively, it may be in a divided ring shape. FIG. 9 is a top view illustrating a semiconductor apparatus having a divided ring-shaped penetration electrode.

As shown in FIG. 9, in a semiconductor apparatus 60, the penetration electrode 61 is formed in a ring shape along the outer periphery of a semiconductor substrate 11, and the penetration electrode 61 is divided into four segments by regions 61a, 61b, 61c, 61d enclosed by broken lines.

When the penetration electrode is in the ring shape, the outer periphery of the semiconductor substrate 11 is separated by the trench 41 from the central portion of the semiconductor substrate 11. The outer periphery of the semiconductor substrate 11 and the central portion of the semiconductor substrate 11 are only connected via the NiAu plated layer 34 formed to be buried into the trench 41. As a result, the mechanical rigidity of the outer periphery of the semiconductor substrate 11 is reduced.

On the other hand, when the penetration electrode is in a divided ring shape, the outer periphery of the semiconductor substrate 11 and the central portion of the semiconductor substrate 11 are continuous via the regions 61*a*, 61*b*, 61*c*, 61*d* enclosed by broken lines, and therefore, there is an advantage in that decrease of the mechanical rigidity of the outer periphery of the semiconductor substrate 11 can be prevented. It should be noted that the divided portions, the divided lengths, and the like are not particularly limited and can be defined appropriately. However, it is desirable to define the divided portions, the divided lengths, and the like as uniformly as possible.

Further, wirings may be formed in the regions 61*a*, 61*b*, 61*c*, 61*d* enclosed by broken lines, so that the divided penetration electrodes 61 may be electrically connected with each other. In this configuration, the same electrical characteristics as those of the closed ring-shaped penetration electrode 16 as shown in FIG. 1 can be obtained while the mechanical rigidity of the outer periphery of the semiconductor substrate 11 is maintained.

Figure 10:
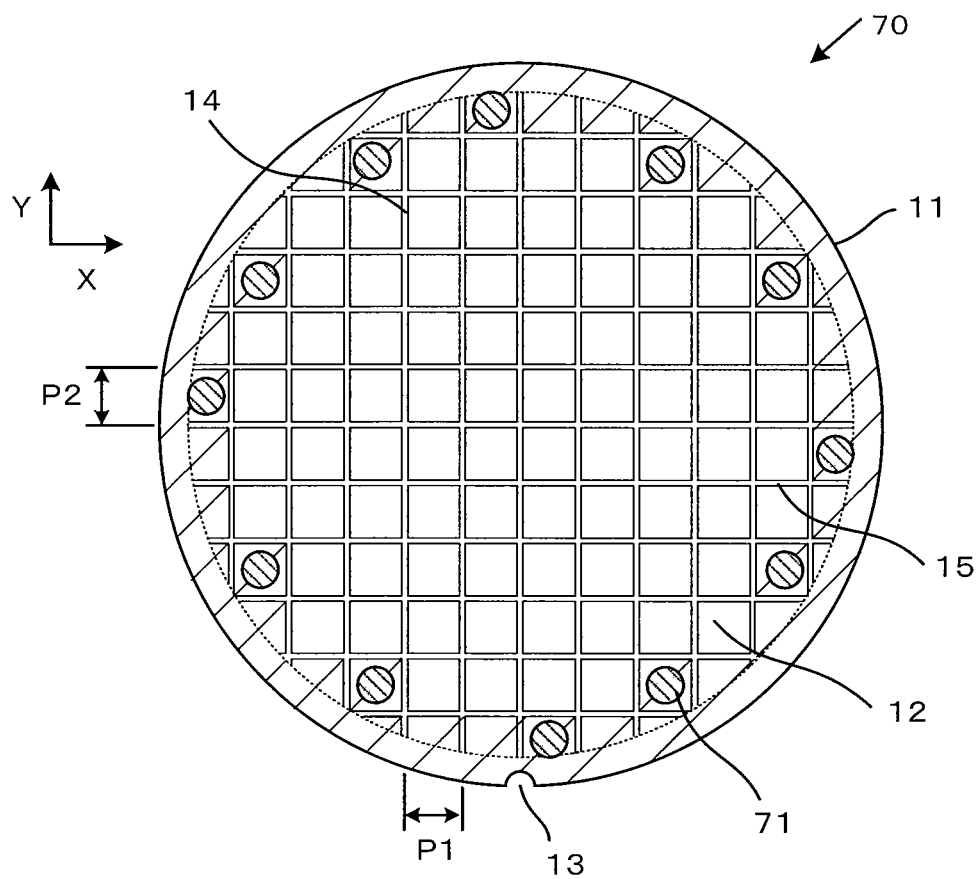
FIG. 10 is a top view illustrating further another semiconductor apparatus according to the embodiment.

Alternatively, the penetration electrodes may be formed in a dispersed manner in the region that is not enclosed by the dicing lines 14, 15 of the semiconductor substrate 11. FIG. 10 is a top view illustrating a semiconductor apparatus having penetration electrodes formed in a dispersed manner.

As shown in FIG. 10, in the semiconductor apparatus 70, the penetration electrodes 71 are formed in a dispersed manner in the region not enclosed by the dicing lines 14, 15 of the semiconductor substrate 11. Also the penetration electrodes 71 are formed in such a manner that the penetration electrodes 71 do not overlap the dicing lines 14, 15.

When the penetration electrode is in the ring shape, the penetration electrode is also diced when the semiconductor substrate 11 is diced along the dicing lines 14, 15. As a result, the blade is clogged, which reduces the quality of dicing.

On the other hand, when the penetration electrodes are formed in a dispersed manner in the region not enclosed by the dicing lines 14, 15 in such a manner that the penetration electrodes do not overlap the dicing lines 14, 15, the penetration electrodes are not diced. As a result, there is an advantage in that reduction of the quality of dicing due to the clogged blade can be prevented.

It should be noted that the penetration electrodes 71 are desirably made thicker than the widths of the rings of the penetration electrodes 16, 61 as shown in FIGS. 1 and 9. This is because the resistances of the penetration electrodes 71 during conduction are brought closer to the resistances of the penetration electrodes 16, 61 during conduction.

In the above explanation, the insulating film 30 is formed by the CVD method. Alternatively, the insulating film 30 may be formed by a thermal oxidation method. In such case, the insulating film 30 can be formed in the same step as a step of producing the semiconductor device 12, e.g., the step of forming a field oxide film for device isolation, for example, so that the insulating film 30 can be formed at the same time when the field oxide film is formed. There is an advantage in that a new step required for producing the penetration electrode 16 can be eliminated.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor apparatus, comprising:
    a semiconductor substrate having a first surface and a second surface opposite to the first surface;
    a semiconductor device in a first region of the semiconductor substrate, the first region being enclosed by a plurality of dicing lines on the semiconductor substrate, the semiconductor device including a first electrode on the first surface and a second electrode on the second surface; and
    a penetration electrode formed in a second region of the semiconductor substrate outside the first region and at an outer periphery of the semiconductor substrate, a first end of the penetration electrode being exposed at the first surface and a second end of the penetration electrode being electrically connected to the second electrode on the second surface, the penetration electrode having a plurality of segments disposed in a ring shape along the outer periphery of the semiconductor substrate.

2. The semiconductor apparatus according to claim 1, wherein the plurality of segments is dispersed in the second region.

3. The semiconductor apparatus according to claim 2, wherein the plurality of segments does not overlap the plurality of dicing lines.

4. The semiconductor apparatus according to claim 1, wherein the penetration electrode is a conductive member that is formed in a through-hole and on the first surface of the semiconductor substrate with an insulating film interposed therebetween.

5. The semiconductor apparatus according to claim 4, wherein the conductive member is a laminated conductive body including a barrier metal layer on the insulating film, a seed layer on the barrier metal, and a plated layer on the seed layer.

6. The semiconductor apparatus according to claim 5, wherein the barrier metal layer is a titanium tungsten layer, the seed layer is an aluminum layer and the plated layer is a nickel gold layer.

7. The semiconductor apparatus according to claim 5, wherein an end portion of the laminated conductive body protrudes from the second surface.

8. A semiconductor apparatus, comprising:
    a semiconductor substrate having a first surface and a second surface opposite to the first surface;
    a semiconductor device in a first region of the semiconductor substrate, the first region enclosed by a plurality of dicing lines on the semiconductor substrate, the semiconductor device including a first electrode on the first surface and a second electrode on the second surface;
    a penetration electrode in a second region of the semiconductor substrate outside the first region and along an outer periphery of the semiconductor substrate, a first end of the penetration electrode being exposed at the first surface and a second end of the penetration electrode being electrically connected to the second electrode on the second surface, the penetration electrode having a plurality of segments disposed in a ring shape along the outer periphery of the semiconductor substrate; and a wiring formed on the first surface of the semiconductor substrate, the wiring electrically connecting adjacent segments of the penetration electrode to each other.

9. The semiconductor apparatus according to claim 8, wherein the penetration electrode is a conductive member that is formed in a through-hole and on the first surface of the semiconductor substrate with an insulating film interposed therebetween.

10. The semiconductor apparatus according to claim 9, wherein the conductive member is a laminated conductive body comprising a barrier metal layer on the insulating film, a seed layer on the barrier metal, and a plated layer on the seed layer.

11. The semiconductor apparatus according to claim 10, wherein the barrier metal layer is a titanium tungsten layer, the seed layer is an aluminum layer and the plated layer is a nickel gold layer.

12. The semiconductor apparatus according to claim 10, wherein an end portion of the laminated conductive body protrudes from the second surface.

\* \* \* \* \*